US012660215B2

(12) United States Patent
Chen et al.

(10) Patent No.: US 12,660,215 B2
(45) Date of Patent: Jun. 16, 2026

(54) SEMICONDUCTOR DEVICE STRUCTURE WITH ELECTRODE LAYER AND METHOD FOR FORMING THE SAME

(71) Applicant: Taiwan Semiconductor Manufacturing Company, Ltd., Hsinchu (TW)

(72) Inventors: Wen-Tzu Chen, Taoyuan city (TW); Shih-Cheng Chou, Hsinchu City (TW); Hsiang-Ku Shen, Hsinchu City (TW); Dian-Hau Chen, Hsinchu (TW); Chen-Chiu Huang, Taichung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 431 days.

(21) Appl. No.: 18/329,729

(22) Filed: Jun. 6, 2023

(65) Prior Publication Data

US 2024/0413193 A1     Dec. 12, 2024

(51) Int. Cl.
| | |
|---|---|
| *H10D 1/68* | (2025.01) |
| *H10B 12/00* | (2023.01) |
| *H10D 1/00* | (2025.01) |
| *H10W 20/40* | (2026.01) |

(52) U.S. Cl.
CPC ............ *H10D 1/696* (2025.01); *H10B 12/01* (2023.02); *H10B 12/31* (2023.02); *H10D 1/042* (2025.01); *H10D 1/043* (2025.01); *H10D 1/712* (2025.01); *H10D 1/716* (2025.01); *H10W 20/496* (2026.01)

(58) Field of Classification Search
CPC ........ H10B 12/31; H10B 12/01; H10D 1/696; H10D 1/711; H10D 1/712; H10D 1/716; H10D 1/042
See application file for complete search history.

(56) References Cited

U.S. PATENT DOCUMENTS

| | | | | |
|---|---|---|---|---|
| 5,753,551 A * | 5/1998 | Sung ...................... | H10B 12/01 |
| | | | | 438/564 |
| 6,046,489 A * | 4/2000 | Yamaguchi .......... | H10B 12/033 |
| | | | | 257/532 |
| 2018/0337000 A1* | 11/2018 | Jen .......................... | H10D 1/716 |
| 2020/0111660 A1* | 4/2020 | Park .................. | H01L 21/76843 |

\* cited by examiner

*Primary Examiner* — Jose R Diaz
(74) *Attorney, Agent, or Firm* — McClure, Qualey & Rodack, LLP

(57) ABSTRACT

A method for forming a semiconductor device structure is provided. The method includes forming a first electrode layer over a substrate. The method includes forming a capacitor dielectric layer over the first electrode layer and the substrate. The method includes depositing a second electrode layer over the capacitor dielectric layer. The method includes bombarding the second electrode layer with ions of an inert gas to sputter first atoms from the second electrode layer. The treated second electrode layer has a treated first top portion, a treated first sidewall portion, and a treated first bottom portion. The treated first sidewall portion is over the sidewall of the first electrode layer and connected between the treated first top portion and the treated first bottom portion, and the treated first sidewall portion is thicker than the first sidewall portion.

20 Claims, 12 Drawing Sheets

700

800

SEMICONDUCTOR DEVICE STRUCTURE WITH ELECTRODE LAYER AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a schematic diagram illustrating a chamber and the semiconductor device structure of FIGS. 1A-1D, in accordance with some embodiments.

FIG. 3A-1 is a schematic diagram illustrating a chamber and the semiconductor device structure of FIGS. 3A-3H, in accordance with some embodiments.

FIG. 5A-1 is a schematic diagram illustrating a chamber and the semiconductor device structure of FIGS. 5A-5B, in accordance with some embodiments.

DETAILED DESCRIPTION

Figure 1A:
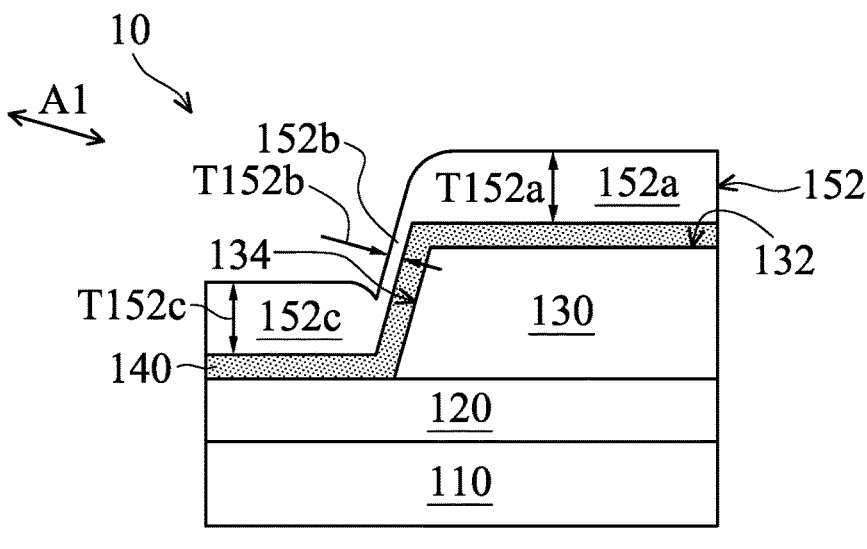
FIGS. 1A-1E are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1E are cross-sectional views of various stages of a process for forming a semiconductor device structure, in accordance with some embodiments. As shown in FIG. 1A, a substrate 110 is provided, in accordance with some embodiments. The substrate 110 includes, for example, a semiconductor substrate. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, an interconnect structure 120 is formed over the substrate 110, in accordance with some embodiments. The interconnect structure 120 includes a dielectric layer (not shown), wiring layers (not shown), and conductive vias (not shown), in accordance with some embodiments. The wiring layers and the conductive vias are in the dielectric layer, in accordance with some embodiments. The conductive vias are electrically connected between the wiring layers and the device elements, in accordance with some embodiments.

The dielectric layer is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer includes a low-k material or a porous dielectric material having a k-value which is lower than that of silicon oxide, or lower than about 3.0 or about 2.5, in accordance with some embodiments. The wiring layers and the conductive vias are made of a conductive material, such as metal (e.g., copper, aluminum, gold, silver, or tungsten) or alloys thereof, in accordance with some embodiments.

As shown in FIG. 1A, an electrode layer 130 is formed over the interconnect structure 120, in accordance with some embodiments. The electrode layer 130 is made of a metal-containing material, such as metal nitride (e.g., titanium nitride (TiN)) or another suitable conductive material.

As shown in FIG. 1A, a capacitor dielectric layer 140 is formed over the electrode layer 130 and the interconnect structure 120, in accordance with some embodiments. The capacitor dielectric layer 140 conformally covers a top surface 132 and a sidewall 134 of the electrode layer 130, in accordance with some embodiments.

The capacitor dielectric layer 140 is made of a dielectric material, such as a high dielectric constant (high-k) material, in accordance with some embodiments. The high-k material includes metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), aluminum oxide, hafnium dioxide-alumina ($HfO_2$—$Al_2O_3$) alloy, other suitable high-k dielectric materials, or combinations thereof, in accordance with some embodiments.

In some other embodiments, the high-k material includes metal nitrides, metal silicates, transition metal-oxides, transition metal-nitrides, transition metal-silicates, oxynitrides of metals, other suitable materials, or combinations thereof.

Figures 1, 1A:
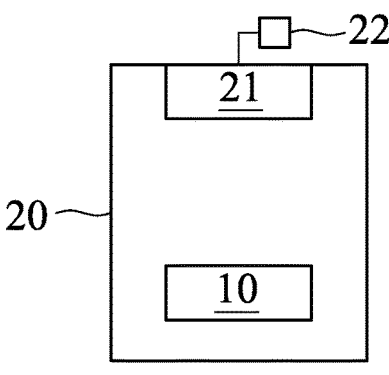

The substrate 110, the interconnect structure 120, the electrode layer 130, and the capacitor dielectric layer 140 together form a semiconductor device structure 10, in accordance with some embodiments. FIG. 1A-1 is a schematic diagram illustrating a chamber 20 and the semiconductor device structure 10, in accordance with some embodiments.

As shown in FIGS. 1A and 1A-1, the semiconductor device structure 10 is disposed in the chamber 20, in accordance with some embodiments. The chamber 20 includes a physical vapor deposition chamber, in accordance with some embodiments. The chamber 20 has a target 21, in accordance with some embodiments. The target 21 may be used as a cathode. The target 21 is made of a conductive material such as metal (e.g., Ti), in accordance with some embodiments.

The target 21 is coupled to a power supply 22, in accordance with some embodiments. The power supply 22 includes an RF power supply, a DC power supply, or a pulsed DC power supply, in accordance with some embodiments. As shown in FIG. 1A, an electrode layer 152 is deposited over the capacitor dielectric layer 140, in accordance with some embodiments.

The electrode layer 152 has a top portion 152a, a sidewall portion 152b, and a bottom portion 152c, in accordance with some embodiments. The top portion 152a is over the capacitor dielectric layer 140 over the top surface 132 of the electrode layer 130, in accordance with some embodiments. The sidewall portion 152b is over the capacitor dielectric layer 140 over the sidewall 134 of the electrode layer 130, in accordance with some embodiments. The sidewall portion 152b is connected between the top portion 152a and the bottom portion 152c, in accordance with some embodiments. The bottom portion 152c does not overlap the electrode layer 130, in accordance with some embodiments.

5

The sidewall portion 152b is thinner than the top portion 152a, in accordance with some embodiments. That is, the thickness T152b of the sidewall portion 152b is less than the thickness T152a of the top portion 152a, in accordance with some embodiments. The sidewall portion 152b is thinner than the bottom portion 152c, in accordance with some embodiments. That is, the thickness T152b of the sidewall portion 152b is less than the thickness T152c of the bottom portion 152c, in accordance with some embodiments. The thickness T152b is measured along an axis A1 perpendicular to the sidewall 134 of the electrode layer 130, in accordance with some embodiments.

The electrode layer 152 is deposited using a physical vapor deposition process, in accordance with some embodiments. As shown in FIG. 1A-1, in the physical vapor deposition process, the power supply 22 delivers a sputtering power to the target 21, in accordance with some embodiments.

The sputtering power is about 0 watt (W), in accordance with some embodiments. In the physical vapor deposition process, an inert gas, such as argon, is flown into the chamber 20 at a rate sufficient to produce a chamber pressure of about 10 mTorr to about 50 mTorr, in accordance with some embodiments.

If the chamber pressure is less than 10 mTorr, the deposition rate of the physical vapor deposition process may be too low and the process time may be too long. If the chamber pressure is greater than 50 mTorr, the deposition rate of the physical vapor deposition process may be too high, which may generate fractures or cracks in the electrode layer 152. The chamber pressure is also referred to as a process pressure, in accordance with some embodiments.

Figure 1B:
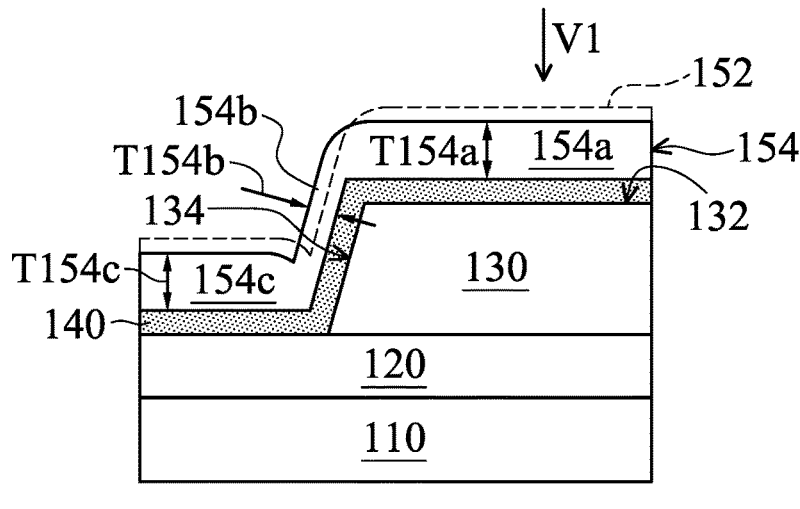

As shown in FIGS. 1A, 1A-1, and 1B, the electrode layer 152 is bombarded with ions of the inert gas to sputter atoms from the electrode layer 152, in accordance with some embodiments. The atoms are deposited to the electrode layer 152 after the bombardment process, in accordance with some embodiments. Therefore, the bombardment process can modify the profile of the electrode layer 152, in accordance with some embodiments.

Specifically, the bombardment process uses the ions (e.g., Ar+) of the inert gas to anisotropically bombard the electrode layer 152, in accordance with some embodiments. The bombardment direction V1 of the ions is substantially perpendicular to the top surface 132 of the electrode layer 130, in accordance with some embodiments. The chamber pressure of the bombardment process is greater than that of the PVD process of forming the electrode layer 152, in accordance with some embodiments. Then, the atoms are isotropically deposited to the bombarded electrode layer 152, in accordance with some embodiments.

As shown in FIG. 1B, the electrode layer 152 becomes a treated electrode layer 154 after the atoms are deposited to the bombarded electrode layer 152, in accordance with some embodiments. It should be noted that in FIG. 1B, the dotted line showing the electrode layer 152 is only for comparison with the treated electrode layer 154, not for illustrating that the electrode layer 152 is remained in the semiconductor device structure of FIG. 1B.

The treated electrode layer 154 has a treated top portion 154a, a treated sidewall portion 154b, and a treated bottom portion 154c, in accordance with some embodiments. The treated top portion 154a is over the top surface 132 of the electrode layer 130, in accordance with some embodiments. The treated sidewall portion 154b is over the sidewall 134 of the electrode layer 130, in accordance with some embodiments.

6

The treated sidewall portion 154b is connected between the treated top portion 154a and the treated bottom portion 154c, in accordance with some embodiments. The treated bottom portion 154c does not overlap the electrode layer 130, in accordance with some embodiments. The treated top portion 154a is higher than the treated sidewall portion 154b, in accordance with some embodiments. The treated bottom portion 154c is lower than the treated sidewall portion 154b, in accordance with some embodiments.

As shown in FIGS. 1A and 1B, since the bombardment process is an anisotropic bombardment process, the thickness reduction of the top portion 152a and the bottom portion 152c, which have larger horizontal areas, is greater than that of the sidewall portion 152b, which has a smaller horizontal area, in accordance with some embodiments. Furthermore, since the atoms are isotropically deposited to the bombarded electrode layer 152, the thickness of the entire bombarded electrode layer 152 is increased uniformly, in accordance with some embodiments.

Therefore, as shown in FIGS. 1A and 1B, the treated top portion 154a of the treated electrode layer 154 is thinner than the top portion 152a of the electrode layer 152, in accordance with some embodiments. That is, the thickness T154a of the treated top portion 154a is less than the thickness T152a of the top portion 152a, in accordance with some embodiments.

The treated bottom portion 154c of the treated electrode layer 154 is thinner than the bottom portion 152c of the electrode layer 152, in accordance with some embodiments. That is, the thickness T154c of the treated bottom portion 154c is less than the thickness T152c of the bottom portion 152c, in accordance with some embodiments.

The treated sidewall portion 154b is thicker than the sidewall portion 152b, in accordance with some embodiments. That is, the thickness T154b of the treated sidewall portion 154b is greater than the thickness T152b of the sidewall portion 152b, in accordance with some embodiments.

As shown in FIG. 1B, the treated sidewall portion 154b is thinner than the treated top portion 154a, in accordance with some embodiments. The treated sidewall portion 154b is thinner than the treated bottom portion 154c, in accordance with some embodiments. As shown in FIGS. 1A and 1B, a thickness difference between the treated top portion 154a and the treated sidewall portion 154b is less than a thickness difference between the top portion 152a and the sidewall portion 152b, in accordance with some embodiments.

As shown in FIGS. 1A and 1B, a thickness difference between the treated bottom portion 154c and the treated sidewall portion 154b is less than a thickness difference between the bottom portion 152c and the sidewall portion 152b, in accordance with some embodiments. That is, the bombardment process and the deposition of the atoms improve the thickness uniformity of the treated electrode layer 154, which improves the stability of a capacitor with the treated electrode layer 154, in accordance with some embodiments.

In some embodiments, a surface roughness of the treated sidewall portion 154b is greater than a surface roughness of the treated top portion 154a. In some embodiments, the surface roughness of the treated sidewall portion 154b is greater than a surface roughness of the treated bottom portion 154c. In some embodiments, the deposition process and the bombardment process of the electrode layer 152 are performed in the same chamber 20 of FIG. 1A-1 (i.e., performed in-situ).

Figure 1C:
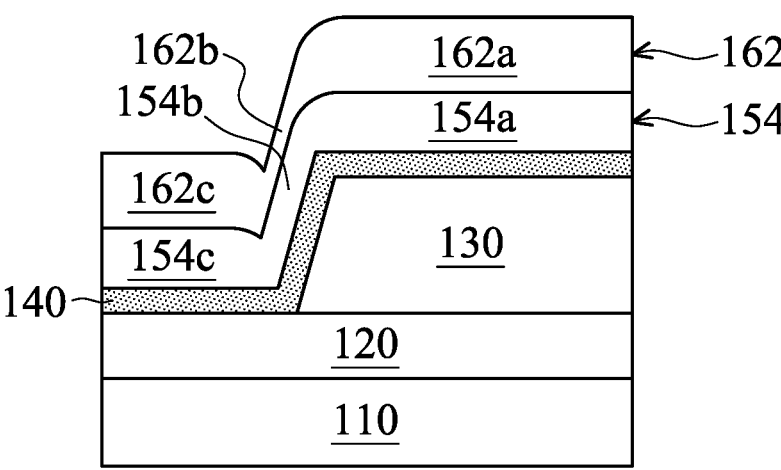

As shown in FIG. 1C, an electrode layer 162 is deposited over the treated electrode layer 154, in accordance with some embodiments. The electrode layer 162 has a top portion 162a, a sidewall portion 162b, and a bottom portion 162c, in accordance with some embodiments. The top portion 162a is over the treated top portion 154a, in accordance with some embodiments.

The sidewall portion 162b is over the treated sidewall portion 154b, in accordance with some embodiments. The sidewall portion 162b is connected between the top portion 162a and the bottom portion 162c, in accordance with some embodiments.

The bottom portion 162c does not overlap the electrode layer 130, in accordance with some embodiments. The sidewall portion 162b is thinner than the top portion 162a, in accordance with some embodiments. The sidewall portion 162b is thinner than the bottom portion 162c, in accordance with some embodiments.

The electrode layer 162 is deposited using a physical vapor deposition process, in accordance with some embodiments. The physical vapor deposition process is similar to the physical vapor deposition process of forming the electrode layer 152 of FIG. 1A, in accordance with some embodiments.

Figure 1D:
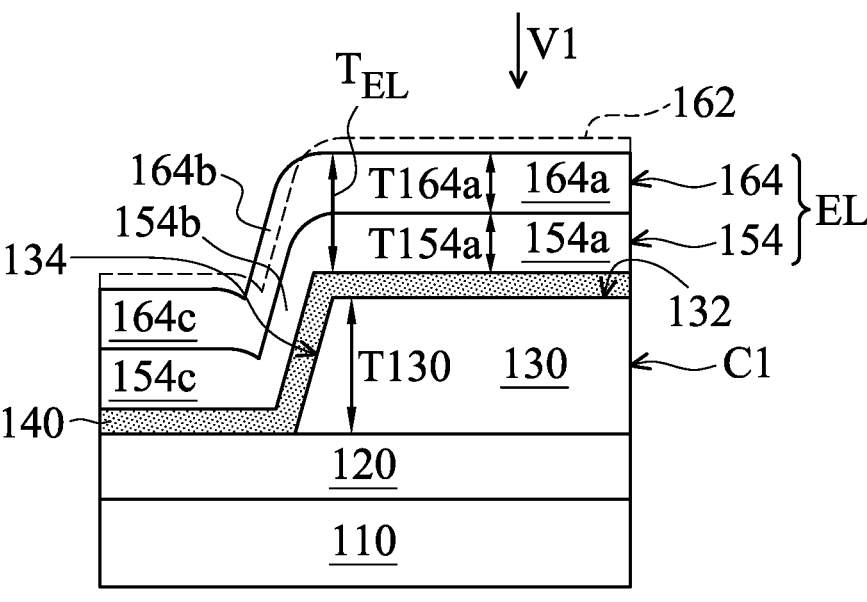

As shown in FIGS. 1C and 1D, the electrode layer 162 is bombarded with the ions of the inert gas to sputter atoms from the electrode layer 162, in accordance with some embodiments. The atoms are deposited to the electrode layer 162 after the bombardment process, in accordance with some embodiments. Therefore, the bombardment process can modify the profile of the electrode layer 162, in accordance with some embodiments.

Specifically, the bombardment process uses the ions (e.g., Ar+) to anisotropically bombard the electrode layer 162, in accordance with some embodiments. The bombardment direction V1 of the ions is substantially perpendicular to the top surface 132 of the electrode layer 130, in accordance with some embodiments. Then, the atoms are isotropically deposited to the bombarded electrode layer 162, in accordance with some embodiments.

As shown in FIG. 1D, the electrode layer 162 becomes a treated electrode layer 164 after the atoms are deposited to the bombarded electrode layer 162, in accordance with some embodiments. It should be noted that in FIG. 1D, the dotted line showing the electrode layer 162 is only for comparison with the treated electrode layer 164, not for illustrating that the electrode layer 162 is remained in the semiconductor device structure of FIG. 1D.

The treated electrode layer 164 has a treated top portion 164a, a treated sidewall portion 164b, and a treated bottom portion 164c, in accordance with some embodiments. The treated top portion 164a is over the top surface 132 of the electrode layer 130, in accordance with some embodiments. The treated sidewall portion 164b is over the sidewall 134 of the electrode layer 130, in accordance with some embodiments.

The treated sidewall portion 164b is connected between the treated top portion 164a and the treated bottom portion 164c, in accordance with some embodiments. The treated bottom portion 164c does not overlap the electrode layer 130, in accordance with some embodiments. The treated top portion 164a is higher than the treated sidewall portion 164b, in accordance with some embodiments. The treated bottom portion 164c is lower than the treated sidewall portion 164b, in accordance with some embodiments.

As shown in FIGS. 1C and 1D, since the bombardment process is an anisotropic bombardment process, the thickness reduction of the top portion 162a and the bottom portion 162c, which have larger horizontal areas, is greater than that of the sidewall portion 162b, which has a smaller horizontal area, in accordance with some embodiments. Furthermore, since the atoms are isotropically deposited to the bombarded electrode layer 162, the thickness of the entire bombarded electrode layer 162 is increased uniformly, in accordance with some embodiments.

Therefore, as shown in FIGS. 1C and 1D, the treated top portion 164a of the treated electrode layer 164 is thinner than the top portion 162a of the electrode layer 162, in accordance with some embodiments. The treated bottom portion 164c of the treated electrode layer 164 is thinner than the bottom portion 162c of the electrode layer 162, in accordance with some embodiments. The treated sidewall portion 164b is thicker than the sidewall portion 162b, in accordance with some embodiments.

As shown in FIG. 1D, the treated sidewall portion 164b is thinner than the treated top portion 164a, in accordance with some embodiments. The treated sidewall portion 164b is thinner than the treated bottom portion 164c, in accordance with some embodiments. As shown in FIGS. 1C and 1D, a thickness difference between the treated top portion 164a and the treated sidewall portion 164b is less than a thickness difference between the top portion 162a and the sidewall portion 162b, in accordance with some embodiments.

As shown in FIGS. 1C and 1D, a thickness difference between the treated bottom portion 164c and the treated sidewall portion 164b is less than a thickness difference between the bottom portion 162c and the sidewall portion 162b, in accordance with some embodiments. That is, the bombardment process and the deposition of the atoms improve the thickness uniformity of the treated electrode layer 164, which improves the stability of a capacitor with the treated electrode layer 164, in accordance with some embodiments.

In some embodiments, a surface roughness of the treated sidewall portion 164b is greater than a surface roughness of the treated top portion 164a. In some embodiments, the surface roughness of the treated sidewall portion 164b is greater than a surface roughness of the treated bottom portion 164c. In some embodiments, the deposition process and the bombardment process of the electrode layer 162 are performed in the same chamber 20 of FIG. 1A-1 (i.e., performed in-situ).

The treated electrode layers 154 and 164 together form an electrode layer EL, in accordance with some embodiments. The thickness TEL of the electrode layer EL is substantially equal to the thickness T130 of the electrode layer 130, in accordance with some embodiments.

In some embodiments, the thickness TEL is greater than the thickness T130. In some embodiments, the thickness TEL is less than the thickness T130. The electrode layers 130 and EL and the capacitor dielectric layer 140 together form a capacitor C1, in accordance with some embodiments.

In some embodiments, the thicknesses T154a and T164a of the treated top portions 154a and 164a are substantially equal to each other. In some other embodiments, the thicknesses T154a and T164a are different from each other. The thickness T154a or T164a ranges from about 150 Å to about 500 Å, in accordance with some embodiments. The thickness T130 ranges from about 300 Å to about 1000 Å, in accordance with some embodiments.

Figure 1E:
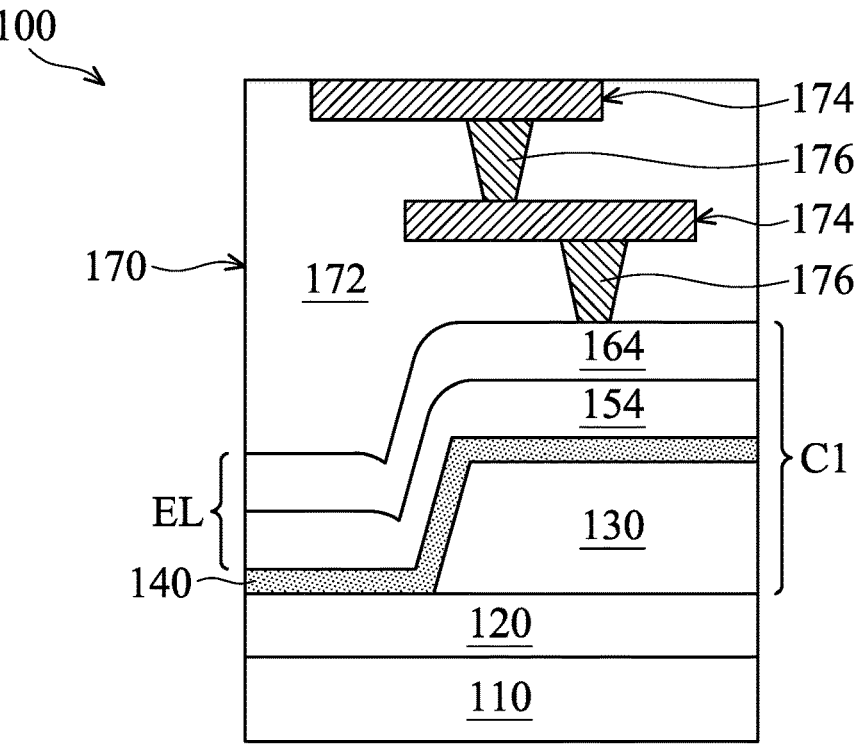

As shown in FIG. 1E, a wiring structure 170 is formed over the capacitor C1 and the interconnect structure 120, in accordance with some embodiments. In this step, a semiconductor device structure 100 is substantially formed, in accordance with some embodiments.

The wiring structure 170 includes a dielectric layer 172, wiring layers 174, and conductive vias 176, in accordance with some embodiments. The wiring layers 174 and the conductive vias 176 are in the dielectric layer 172, in accordance with some embodiments. The conductive vias 176 are electrically connected between the wiring layers 174 and the capacitor C1, in accordance with some embodiments.

The dielectric layer 172 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer 172 includes a low-k material or a porous dielectric material having a k-value which is lower than that of silicon oxide, or lower than about 3.0 or about 2.5, in accordance with some embodiments. The wiring layers 174 and the conductive vias 176 are made of a conductive material, such as metal (e.g., copper, aluminum, gold, silver, or tungsten) or alloys thereof, in accordance with some embodiments.

Figure 2:
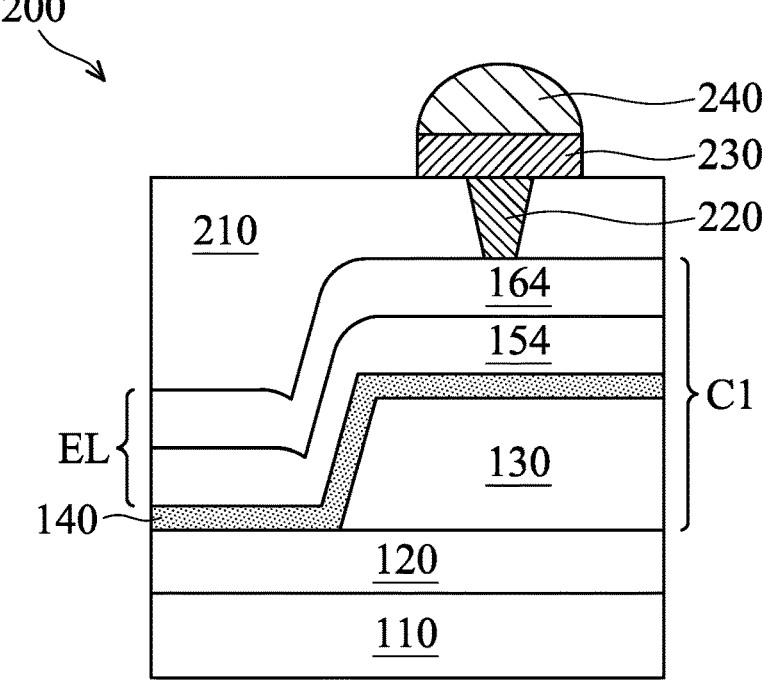
FIG. 2 is a cross-sectional view of a semiconductor device structure, in accordance with some embodiments.

FIG. 2 is a cross-sectional view of a semiconductor device structure, in accordance with some embodiments. As shown in FIG. 2, after the step of FIG. 1D, a dielectric layer 210 is formed over the capacitor C1, in accordance with some embodiments.

The dielectric layer 210 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer 210 includes a low-k material or a porous dielectric material having a k-value which is lower than that of silicon oxide, or lower than about 3.0 or about 2.5, in accordance with some embodiments.

As shown in FIG. 2, a conductive via 220 is formed in the dielectric layer 210, in accordance with some embodiments. The conductive via 220 is connected to the capacitor C1, in accordance with some embodiments. The conductive via 220 is made of a conductive material, such as metal (e.g., copper, aluminum, gold, silver, or tungsten) or alloys thereof, in accordance with some embodiments.

As shown in FIG. 2, a conductive pad 230 is formed over the conductive via 220, in accordance with some embodiments. The conductive pad 230 is made of a conductive material, such as metal (e.g., copper, aluminum, gold, silver, or tungsten) or alloys thereof, in accordance with some embodiments.

As shown in FIG. 2, a solder bump 240 is formed over the conductive pad 230, in accordance with some embodiments. The solder bump 240 is made of a conductive material, such as a tin-based alloy, in accordance with some embodiments. In this step, a semiconductor device structure 200 is substantially formed, in accordance with some embodiments.

Figure 3A:
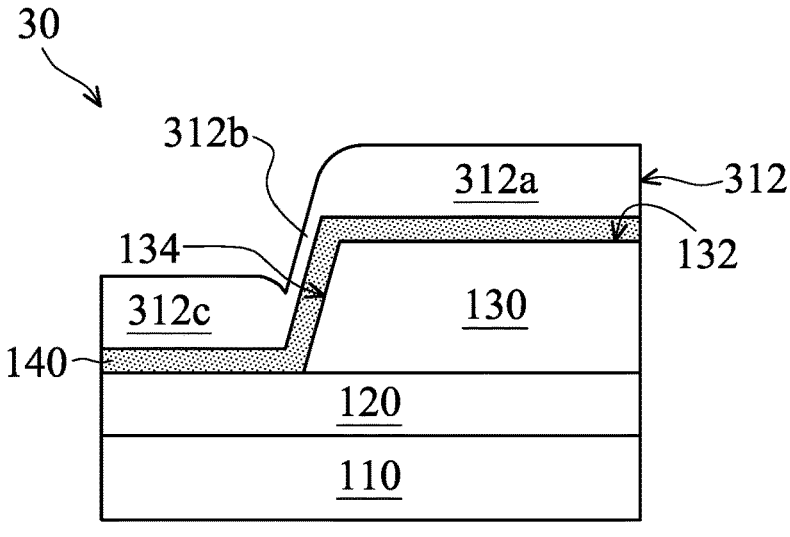
FIGS. 3A-3I are cross-sectional views of various stages of a process for forming a semiconductor device structure, in accordance with some embodiments.
Figures 1, 3A:
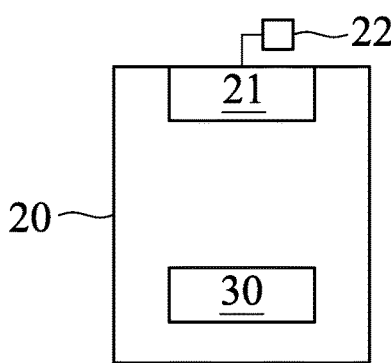

FIGS. 3A-3I are cross-sectional views of various stages of a process for forming a semiconductor device structure, in accordance with some embodiments. FIG. 3A-1 is a schematic diagram illustrating a chamber 20 and a semiconductor device structure 30 of FIGS. 3A-3H, in accordance with some embodiments.

As shown in FIG. 3A, after the step of forming the electrode layer 130 of FIG. 1A, the capacitor dielectric layer 140 is formed over the electrode layer 130 and the interconnect structure 120, in accordance with some embodiments. As shown in FIGS. 3A and 3A-1, the substrate 110, the interconnect structure 120, the electrode layer 130, and the capacitor dielectric layer 140 together form a semiconductor device structure 30, in accordance with some embodiments.

As shown in FIGS. 3A and 3A-1, the semiconductor device structure 30 is disposed in the chamber 20, in accordance with some embodiments. The chamber 20 is the same as the chamber 20 of FIG. 1A-1, in accordance with some embodiments. As shown in FIG. 3A, an electrode layer 312 is formed over the capacitor dielectric layer 140, in accordance with some embodiments.

The electrode layer 312 has a top portion 312a, a sidewall portion 312b, and a bottom portion 312c, in accordance with some embodiments. The top portion 312a is over the capacitor dielectric layer 140 over the top surface 132 of the electrode layer 130, in accordance with some embodiments. The sidewall portion 312b is over the capacitor dielectric layer 140 over the sidewall 134 of the electrode layer 130, in accordance with some embodiments. The sidewall portion 312b is connected between the top portion 312a and the bottom portion 312c, in accordance with some embodiments.

The sidewall portion 312b is thinner than the top portion 312a, in accordance with some embodiments. The sidewall portion 312b is thinner than the bottom portion 312c, in accordance with some embodiments. The electrode layer 312 is deposited using a physical vapor deposition process, in accordance with some embodiments. The physical vapor deposition process may similar to the physical vapor deposition process of forming the electrode layer 152 of FIG. 1A, in accordance with some embodiments.

Figure 3B:
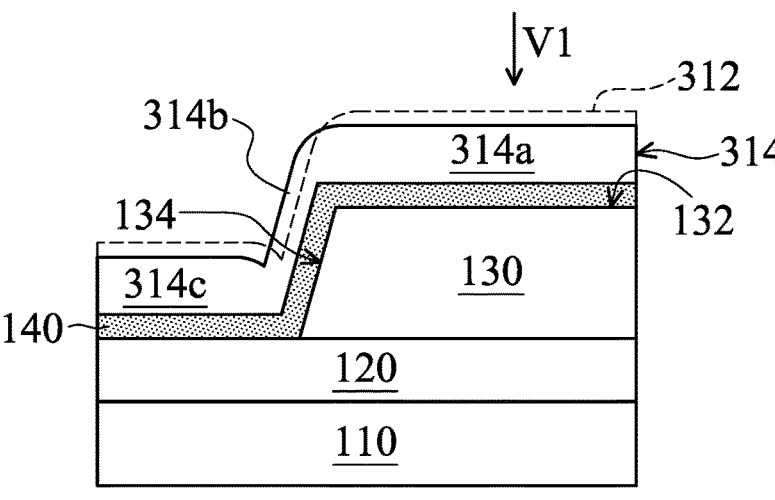

As shown in FIGS. 3A and 3B, the electrode layer 312 is bombarded with ions of the inert gas to sputter atoms from the electrode layer 312, in accordance with some embodiments. The atoms are deposited to the electrode layer 312 after the bombardment process, in accordance with some embodiments. Therefore, the bombardment process can modify the profile of the electrode layer 312, in accordance with some embodiments.

Specifically, the bombardment process uses the ions (e.g., Ar+) of the inert gas to anisotropically bombard the electrode layer 312, in accordance with some embodiments. The bombardment direction V1 of the ions is substantially perpendicular to the top surface 132 of the electrode layer 130, in accordance with some embodiments. Then, the atoms are isotropically deposited to the bombarded electrode layer 312, in accordance with some embodiments.

As shown in FIG. 3B, the electrode layer 312 becomes a treated electrode layer 314 after the atoms are deposited to the bombarded electrode layer 312, in accordance with some embodiments. It should be noted that in FIG. 3B, the dotted line showing the electrode layer 312 is only for comparison with the treated electrode layer 314, not for illustrating that the electrode layer 312 is remained in the semiconductor device structure of FIG. 3B.

The treated electrode layer 314 has a treated top portion 314a, a treated sidewall portion 314b, and a treated bottom portion 314c, in accordance with some embodiments. The treated top portion 314a is over the top surface 132 of the electrode layer 130, in accordance with some embodiments. The treated sidewall portion 314*b* is over the sidewall 134 of the electrode layer 130, in accordance with some embodiments.

The treated sidewall portion 314*b* is connected between the treated top portion 314*a* and the treated bottom portion 314*c*, in accordance with some embodiments. The treated bottom portion 314*c* does not overlap the electrode layer 130, in accordance with some embodiments. The treated top portion 314*a* is higher than the treated sidewall portion 314*b*, in accordance with some embodiments. The treated bottom portion 314*c* is lower than the treated sidewall portion 314*b*, in accordance with some embodiments.

As shown in FIGS. 3A and 3B, since the bombardment process is an anisotropic bombardment process, the thickness reduction of the top portion 312*a* and the bottom portion 312*c*, which have larger horizontal areas, is greater than that of the sidewall portion 312*b*, which has a smaller horizontal area, in accordance with some embodiments. Furthermore, since the atoms are isotropically deposited to the bombarded electrode layer 312, the thickness of the entire bombarded electrode layer 312 is increased uniformly, in accordance with some embodiments.

Therefore, as shown in FIGS. 3A and 3B, the treated top portion 314*a* of the treated electrode layer 314 is thinner than the top portion 312*a* of the electrode layer 312, in accordance with some embodiments. The treated bottom portion 314*c* of the treated electrode layer 314 is thinner than the bottom portion 312*c* of the electrode layer 312, in accordance with some embodiments. The treated sidewall portion 314*b* is thicker than the sidewall portion 312*b*, in accordance with some embodiments.

As shown in FIG. 3B, the treated sidewall portion 314*b* is thinner than the treated top portion 314*a*, in accordance with some embodiments. The treated sidewall portion 314*b* is thinner than the treated bottom portion 314*c*, in accordance with some embodiments. As shown in FIGS. 3A and 3B, a thickness difference between the treated top portion 314*a* and the treated sidewall portion 314*b* is less than a thickness difference between the top portion 312*a* and the sidewall portion 312*b*, in accordance with some embodiments.

As shown in FIGS. 3A and 3B, a thickness difference between the treated bottom portion 314*c* and the treated sidewall portion 314*b* is less than a thickness difference between the bottom portion 312*c* and the sidewall portion 312*b*, in accordance with some embodiments. That is, the bombardment process and the deposition of the atoms improve the thickness uniformity of the treated electrode layer 314, which improves the stability of a capacitor with the treated electrode layer 314, in accordance with some embodiments.

In some embodiments, a surface roughness of the treated sidewall portion 314*b* is greater than a surface roughness of the treated top portion 314*a*. In some embodiments, the surface roughness of the treated sidewall portion 314*b* is greater than a surface roughness of the treated bottom portion 314*c*. In some embodiments, the deposition process and the bombardment process of the electrode layer 312 is performed in the same chamber 20 of FIG. 3A-1 (i.e., performed in-situ).

Figure 3C:
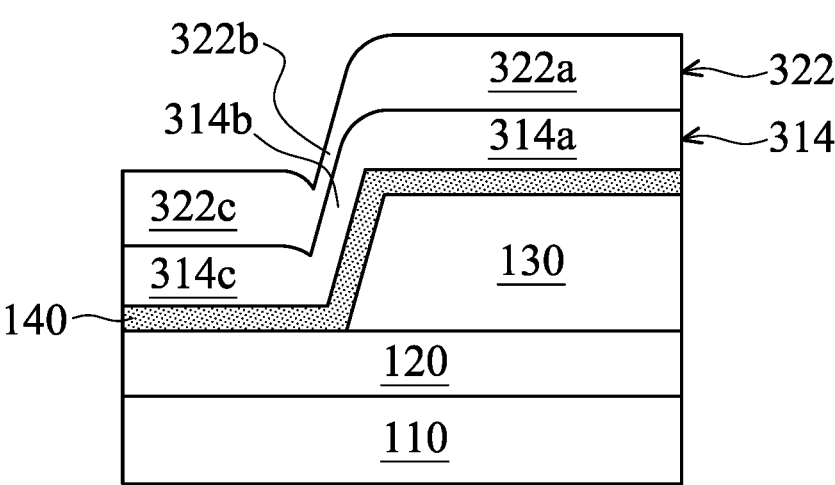

As shown in FIG. 3C, an electrode layer 322 is deposited over the treated electrode layer 314, in accordance with some embodiments. The electrode layer 322 has a top portion 322*a*, a sidewall portion 322*b*, and a bottom portion 322*c*, in accordance with some embodiments. The top portion 322*a* is over the treated top portion 314*a*, in accordance with some embodiments.

The sidewall portion 322*b* is over the treated sidewall portion 314*b*, in accordance with some embodiments. The sidewall portion 322*b* is connected between the top portion 322*a* and the bottom portion 322*c*, in accordance with some embodiments.

The bottom portion 322*c* does not overlap the electrode layer 130, in accordance with some embodiments. The sidewall portion 322*b* is thinner than the top portion 322*a*, in accordance with some embodiments. The sidewall portion 322*b* is thinner than the bottom portion 322*c*, in accordance with some embodiments.

The electrode layer 322 is deposited using a physical vapor deposition process, in accordance with some embodiments. The physical vapor deposition process is similar to the physical vapor deposition process of forming the electrode layer 152 of FIG. 1A, in accordance with some embodiments.

Figure 3D:
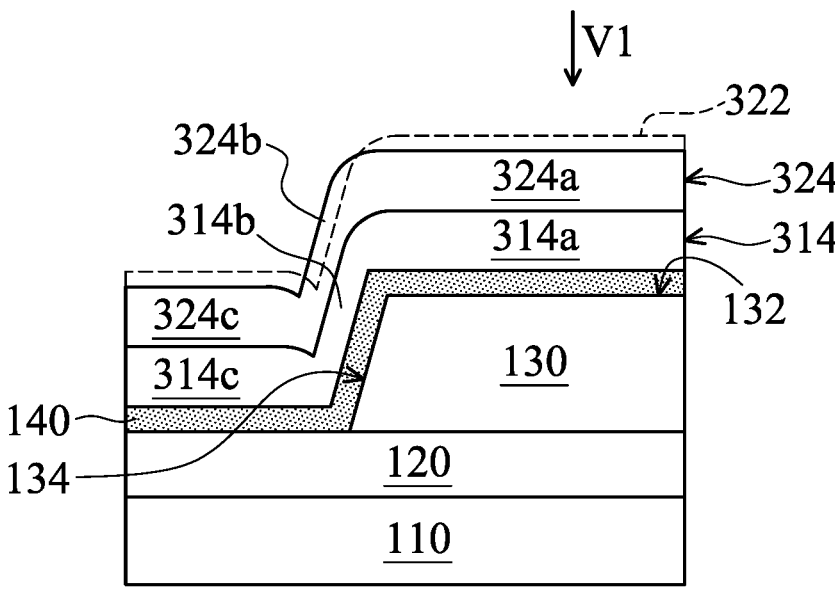

As shown in FIGS. 3C and 3D, the electrode layer 322 is bombarded with the ions of the inert gas to sputter atoms from the electrode layer 322, in accordance with some embodiments. The atoms are deposited to the electrode layer 322 after the bombardment process, in accordance with some embodiments. Therefore, the bombardment process can modify the profile of the electrode layer 322, in accordance with some embodiments.

Specifically, the bombardment process uses the ions (e.g., Ar+) to anisotropically bombard the electrode layer 322, in accordance with some embodiments. The bombardment direction V1 of the ions is substantially perpendicular to the top surface 132 of the electrode layer 130, in accordance with some embodiments. Then, the atoms are isotropically deposited to the bombarded electrode layer 322, in accordance with some embodiments.

As shown in FIG. 3D, the electrode layer 322 becomes a treated electrode layer 324 after the atoms are deposited to the bombarded electrode layer 322, in accordance with some embodiments. It should be noted that in FIG. 3D, the dotted line showing the electrode layer 322 is only for comparison with the treated electrode layer 324, not for illustrating that the electrode layer 322 is remained in the semiconductor device structure of FIG. 3D.

The treated electrode layer 324 has a treated top portion 324*a*, a treated sidewall portion 324*b*, and a treated bottom portion 324*c*, in accordance with some embodiments. The treated top portion 324*a* is over the top surface 132 of the electrode layer 130, in accordance with some embodiments. The treated sidewall portion 324*b* is over the sidewall 134 of the electrode layer 130, in accordance with some embodiments.

The treated sidewall portion 324*b* is connected between the treated top portion 324*a* and the treated bottom portion 324*c*, in accordance with some embodiments. The treated bottom portion 324*c* does not overlap the electrode layer 130, in accordance with some embodiments. The treated top portion 324*a* is higher than the treated sidewall portion 324*b*, in accordance with some embodiments. The treated bottom portion 324*c* is lower than the treated sidewall portion 324*b*, in accordance with some embodiments.

As shown in FIGS. 3C and 3D, since the bombardment process is an anisotropic bombardment process, the thickness reduction of the top portion 322*a* and the bottom portion 322*c*, which have larger horizontal areas, is greater than that of the sidewall portion 322*b*, which has a smaller horizontal area, in accordance with some embodiments. Furthermore, since the atoms are isotropically deposited to the bombarded electrode layer 322, the thickness of the entire bombarded electrode layer 322 is increased uniformly, in accordance with some embodiments.

Therefore, as shown in FIGS. 3C and 3D, the treated top portion 324a of the treated electrode layer 324 is thinner than the top portion 322a of the electrode layer 322, in accordance with some embodiments. The treated bottom portion 324c of the treated electrode layer 324 is thinner than the bottom portion 322c of the electrode layer 322, in accordance with some embodiments. The treated sidewall portion 324b is thicker than the sidewall portion 322b, in accordance with some embodiments.

As shown in FIG. 3D, the treated sidewall portion 324b is thinner than the treated top portion 324a, in accordance with some embodiments. The treated sidewall portion 324b is thinner than the treated bottom portion 324c, in accordance with some embodiments. As shown in FIGS. 3C and 3D, a thickness difference between the treated top portion 324a and the treated sidewall portion 324b is less than a thickness difference between the top portion 322a and the sidewall portion 322b, in accordance with some embodiments.

As shown in FIGS. 3C and 3D, a thickness difference between the treated bottom portion 324c and the treated sidewall portion 324b is less than a thickness difference between the bottom portion 322c and the sidewall portion 322b, in accordance with some embodiments. That is, the bombardment process and the deposition of the atoms improve the thickness uniformity of the treated electrode layer 324, which improves the stability of a capacitor with the treated electrode layer 324, in accordance with some embodiments.

In some embodiments, a surface roughness of the treated sidewall portion 324b is greater than a surface roughness of the treated top portion 324a. In some embodiments, the surface roughness of the treated sidewall portion 324b is greater than a surface roughness of the treated bottom portion 324c. In some embodiments, the deposition process and the bombardment process of the electrode layer 322 are performed in the same chamber 20 of FIG. 3A-1 (i.e., performed in-situ).

Figure 3E:
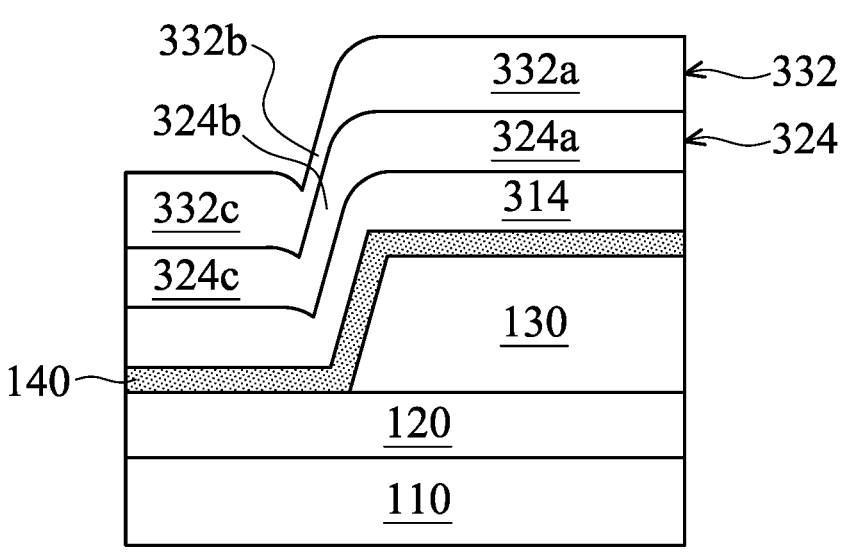

As shown in FIG. 3E, an electrode layer 332 is deposited over the treated electrode layer 324, in accordance with some embodiments. The electrode layer 332 has a top portion 332a, a sidewall portion 332b, and a bottom portion 332c, in accordance with some embodiments. The top portion 332a is over the treated top portion 324a, in accordance with some embodiments.

The sidewall portion 332b is over the treated sidewall portion 324b, in accordance with some embodiments. The sidewall portion 332b is connected between the top portion 332a and the bottom portion 332c, in accordance with some embodiments. The bottom portion 332c does not overlap the electrode layer 130, in accordance with some embodiments. The sidewall portion 332b is thinner than the top portion 332a, in accordance with some embodiments. The sidewall portion 332b is thinner than the bottom portion 332c, in accordance with some embodiments.

The electrode layer 332 is deposited using a physical vapor deposition process, in accordance with some embodiments. The physical vapor deposition process is similar to the physical vapor deposition process of forming the electrode layer 152 of FIG. 1A, in accordance with some embodiments.

Figure 3F:
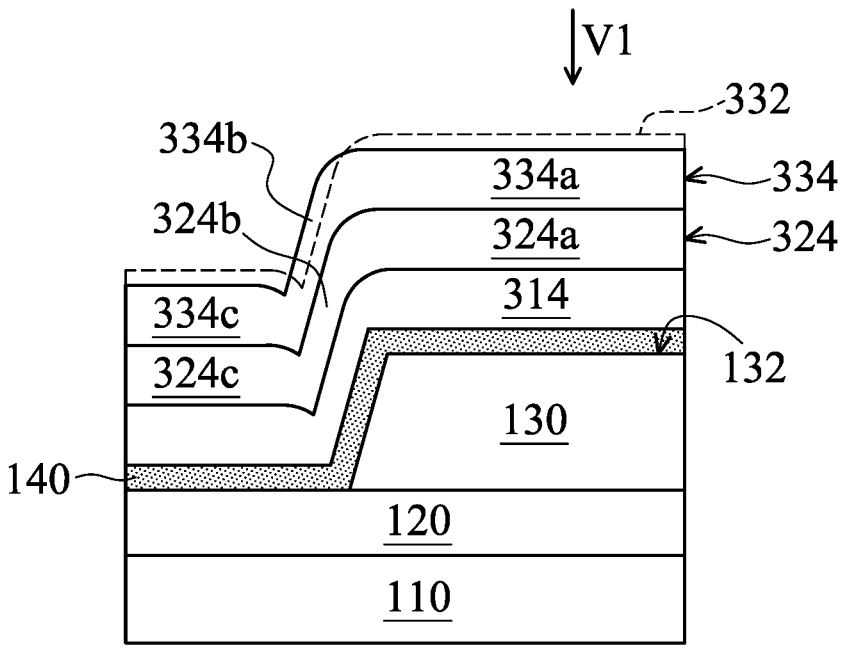

As shown in FIGS. 3E and 3F, the electrode layer 332 is bombarded with the ions of the inert gas to sputter atoms from the electrode layer 332, in accordance with some embodiments. The atoms are deposited to the electrode layer 332 after the bombardment process, in accordance with some embodiments. Therefore, the bombardment process can modify the profile of the electrode layer 332, in accordance with some embodiments.

Specifically, the bombardment process uses the ions (e.g., Ar+) to anisotropically bombard the electrode layer 332, in accordance with some embodiments. The bombardment direction V1 of the ions is substantially perpendicular to the top surface 132 of the electrode layer 130, in accordance with some embodiments. Then, the atoms are isotropically deposited to the bombarded electrode layer 332, in accordance with some embodiments.

As shown in FIG. 3F, the electrode layer 332 becomes a treated electrode layer 334 after the atoms are deposited to the bombarded electrode layer 332, in accordance with some embodiments. It should be noted that in FIG. 3F, the dotted line showing the electrode layer 332 is only for comparison with the treated electrode layer 334, not for illustrating that the electrode layer 332 is remained in the semiconductor device structure of FIG. 3F.

The treated electrode layer 334 has a treated top portion 334a, a treated sidewall portion 334b, and a treated bottom portion 334c, in accordance with some embodiments. The treated top portion 334a is over the treated top portion 324a of the treated electrode layer 324, in accordance with some embodiments. The treated sidewall portion 334b is over the treated sidewall portion 324b of the treated electrode layer 324, in accordance with some embodiments.

The treated sidewall portion 334b is connected between the treated top portion 334a and the treated bottom portion 334c, in accordance with some embodiments. The treated bottom portion 334c does not overlap the electrode layer 130, in accordance with some embodiments. The treated top portion 334a is higher than the treated sidewall portion 334b, in accordance with some embodiments. The treated bottom portion 334c is lower than the treated sidewall portion 334b, in accordance with some embodiments.

As shown in FIGS. 3E and 3F, since the bombardment process is an anisotropic bombardment process, the thickness reduction of the top portion 332a and the bottom portion 332c, which have larger horizontal areas, is greater than that of the sidewall portion 332b, which has a smaller horizontal area, in accordance with some embodiments. Furthermore, since the atoms are isotropically deposited to the bombarded electrode layer 332, the thickness of the entire bombarded electrode layer 332 is increased uniformly, in accordance with some embodiments.

Therefore, as shown in FIGS. 3E and 3F, the treated top portion 334a of the treated electrode layer 334 is thinner than the top portion 332a of the electrode layer 332, in accordance with some embodiments. The treated bottom portion 334c of the treated electrode layer 334 is thinner than the bottom portion 332c of the electrode layer 332, in accordance with some embodiments. The treated sidewall portion 334b is thicker than the sidewall portion 332b, in accordance with some embodiments.

As shown in FIG. 3F, the treated sidewall portion 334b is thinner than the treated top portion 334a, in accordance with some embodiments. The treated sidewall portion 334b is thinner than the treated bottom portion 334c, in accordance with some embodiments. As shown in FIGS. 3E and 3F, a thickness difference between the treated top portion 334a and the treated sidewall portion 334b is less than a thickness difference between the top portion 332a and the sidewall portion 332b, in accordance with some embodiments.

As shown in FIGS. 3E and 3F, a thickness difference between the treated bottom portion 334c and the treated sidewall portion 334b is less than a thickness difference between the bottom portion 332c and the sidewall portion 332b, in accordance with some embodiments. That is, the bombardment process and the deposition of the atoms improve the thickness uniformity of the treated electrode layer 334, which improves the stability of a capacitor with the treated electrode layer 334, in accordance with some embodiments.

In some embodiments, a surface roughness of the treated sidewall portion 334b is greater than a surface roughness of the treated top portion 334a. In some embodiments, the surface roughness of the treated sidewall portion 334b is greater than a surface roughness of the treated bottom portion 334c. In some embodiments, the deposition process and the bombardment process of the electrode layer 332 are performed in the same chamber 20 of FIG. 3A-1 (i.e., performed in-situ).

Figure 3G:
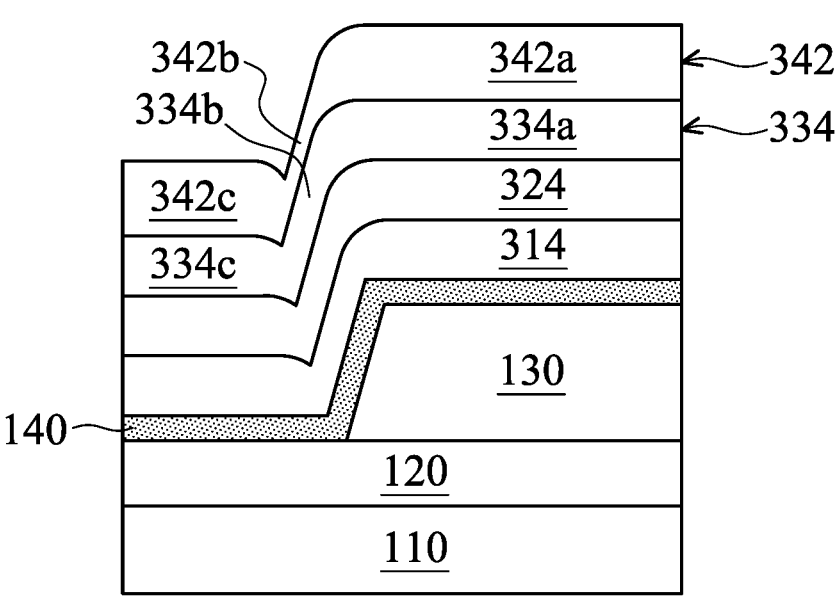

As shown in FIG. 3G, an electrode layer 342 is deposited over the treated electrode layer 334, in accordance with some embodiments. The electrode layer 342 has a top portion 342a, a sidewall portion 342b, and a bottom portion 342c, in accordance with some embodiments. The top portion 342a is over the treated top portion 334a, in accordance with some embodiments.

The sidewall portion 342b is over the treated sidewall portion 334b, in accordance with some embodiments. The sidewall portion 342b is connected between the top portion 342a and the bottom portion 342c, in accordance with some embodiments. The bottom portion 342c does not overlap the electrode layer 130, in accordance with some embodiments. The sidewall portion 342b is thinner than the top portion 342a, in accordance with some embodiments. The sidewall portion 342b is thinner than the bottom portion 342c, in accordance with some embodiments.

The electrode layer 342 is deposited using a physical vapor deposition process, in accordance with some embodiments. The physical vapor deposition process is similar to the physical vapor deposition process of forming the electrode layer 152 of FIG. 1A, in accordance with some embodiments.

Figure 3H:
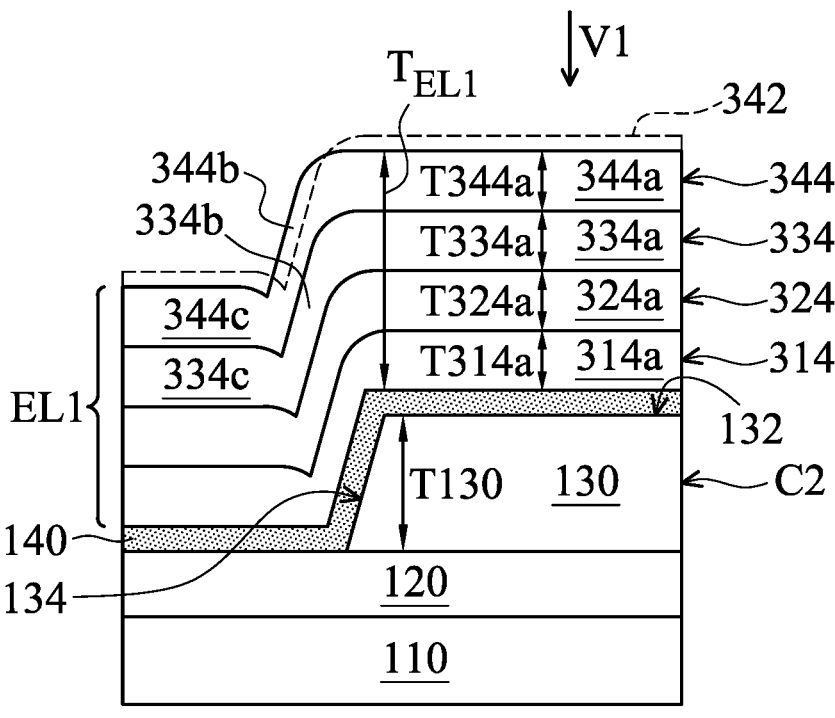

As shown in FIGS. 3G and 3H, the electrode layer 342 is bombarded with the ions of the inert gas to sputter atoms from the electrode layer 342, in accordance with some embodiments. The atoms are deposited to the electrode layer 342 after the bombardment process, in accordance with some embodiments. Therefore, the bombardment process can modify the profile of the electrode layer 342, in accordance with some embodiments.

Specifically, the bombardment process uses the ions (e.g., Ar+) to anisotropically bombard the electrode layer 342, in accordance with some embodiments. The bombardment direction V1 of the ions is substantially perpendicular to the top surface 132 of the electrode layer 130, in accordance with some embodiments. Then, the atoms are isotropically deposited to the bombarded electrode layer 342, in accordance with some embodiments.

As shown in FIG. 3H, the electrode layer 342 becomes a treated electrode layer 344 after the atoms are deposited to the bombarded electrode layer 342, in accordance with some embodiments. It should be noted that in FIG. 3H, the dotted line showing the electrode layer 342 is only for comparison with the treated electrode layer 344, not for illustrating that the electrode layer 342 is remained in the semiconductor device structure of FIG. 3H.

The treated electrode layer 344 has a treated top portion 344a, a treated sidewall portion 344b, and a treated bottom portion 344c, in accordance with some embodiments. The treated top portion 344a is over the treated top portion 334a of the treated electrode layer 334, in accordance with some embodiments. The treated sidewall portion 344b is over the treated sidewall portion 334b of the treated electrode layer 334, in accordance with some embodiments.

The treated sidewall portion 344b is connected between the treated top portion 344a and the treated bottom portion 344c, in accordance with some embodiments. The treated bottom portion 344c does not overlap the electrode layer 130, in accordance with some embodiments. The treated top portion 344a is higher than the treated sidewall portion 344b, in accordance with some embodiments. The treated bottom portion 344c is lower than the treated sidewall portion 344b, in accordance with some embodiments.

As shown in FIGS. 3G and 3H, the treated top portion 344a of the treated electrode layer 344 is thinner than the top portion 342a of the electrode layer 342, in accordance with some embodiments. The treated bottom portion 344c of the treated electrode layer 344 is thinner than the bottom portion 342c of the electrode layer 342, in accordance with some embodiments. The treated sidewall portion 344b is thicker than the sidewall portion 342b, in accordance with some embodiments.

As shown in FIG. 3H, the treated sidewall portion 344b is thinner than the treated top portion 344a, in accordance with some embodiments. The treated sidewall portion 344b is thinner than the treated bottom portion 344c, in accordance with some embodiments. As shown in FIGS. 3G and 3H, a thickness difference between the treated top portion 344a and the treated sidewall portion 344b is less than a thickness difference between the top portion 342a and the sidewall portion 342b, in accordance with some embodiments.

As shown in FIGS. 3G and 3H, a thickness difference between the treated bottom portion 344c and the treated sidewall portion 344b is less than a thickness difference between the bottom portion 342c and the sidewall portion 342b, in accordance with some embodiments. That is, the bombardment process and the deposition of the atoms improve the thickness uniformity of the treated electrode layer 344, which improves the stability of a capacitor with the treated electrode layer 344, in accordance with some embodiments.

In some embodiments, a surface roughness of the treated sidewall portion 344b is greater than a surface roughness of the treated top portion 344a. In some embodiments, the surface roughness of the treated sidewall portion 344b is greater than a surface roughness of the treated bottom portion 344c. In some embodiments, the deposition process and the bombardment process of the electrode layer 342 are performed in the same chamber 20 of FIG. 3A-1 (i.e., performed in-situ).

The treated electrode layers 314, 324, 334 and 344 together form an electrode layer EL1, in accordance with some embodiments. The thickness $T_{EL1}$ of the electrode layer EL1 is substantially equal to the thickness T130 of the electrode layer 130, in accordance with some embodiments.

In some embodiments, the thickness $T_{EL1}$ is greater than the thickness T130. In some embodiments, the thickness $T_{EL1}$ is less than the thickness T130. The electrode layers 130 and EL1 and the capacitor dielectric layer 140 together form a capacitor C2, in accordance with some embodiments.

In some embodiments, the thicknesses T314a, T324a, T334a, and T344a of the treated top portions 314a, 324a, 334a and 344a are substantially equal to each other. In some other embodiments, the thicknesses T314a, T324a, T334a, and T344a are different from each other. The thickness T314a, T324a, T334a, and T344a ranges from about 75 Å to about 250 Å, in accordance with some embodiments. The thickness T130 ranges from about 300 Å to about 1000 Å, in accordance with some embodiments.

Figure 3I:
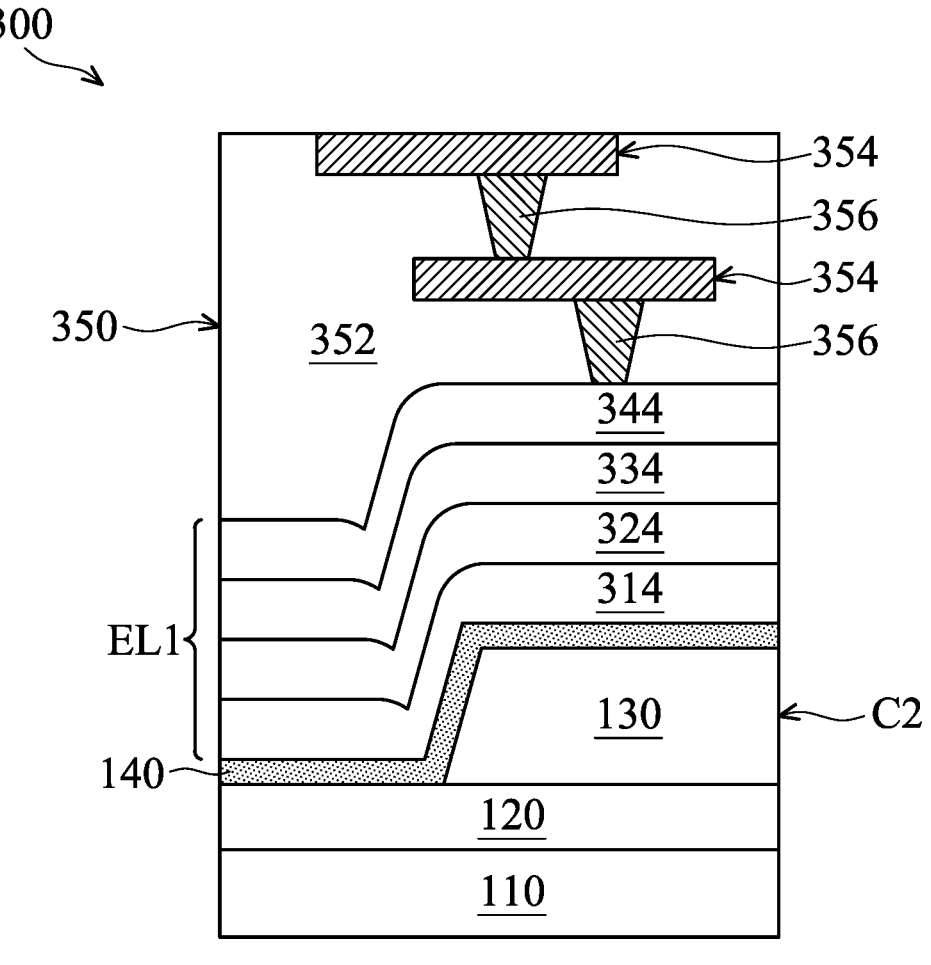

As shown in FIG. 3I, a wiring structure 350 is formed over the capacitor C2 and the interconnect structure 120, in accordance with some embodiments. In this step, a semiconductor device structure 300 is substantially formed, in accordance with some embodiments.

The wiring structure 350 includes a dielectric layer 352, wiring layers 354, and conductive vias 356, in accordance with some embodiments. The wiring layers 354 and the conductive vias 356 are in the dielectric layer 352, in accordance with some embodiments. The conductive vias 356 are electrically connected between the wiring layers 354 and the capacitor C2, in accordance with some embodiments.

The dielectric layer 352 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer 352 includes a low-k material or a porous dielectric material having a k-value which is lower than that of silicon oxide, or lower than about 3.0 or about 2.5, in accordance with some embodiments. The wiring layers 354 and the conductive vias 356 are made of a conductive material, such as metal (e.g., copper, aluminum, gold, silver, or tungsten) or alloys thereof, in accordance with some embodiments.

Figure 4:
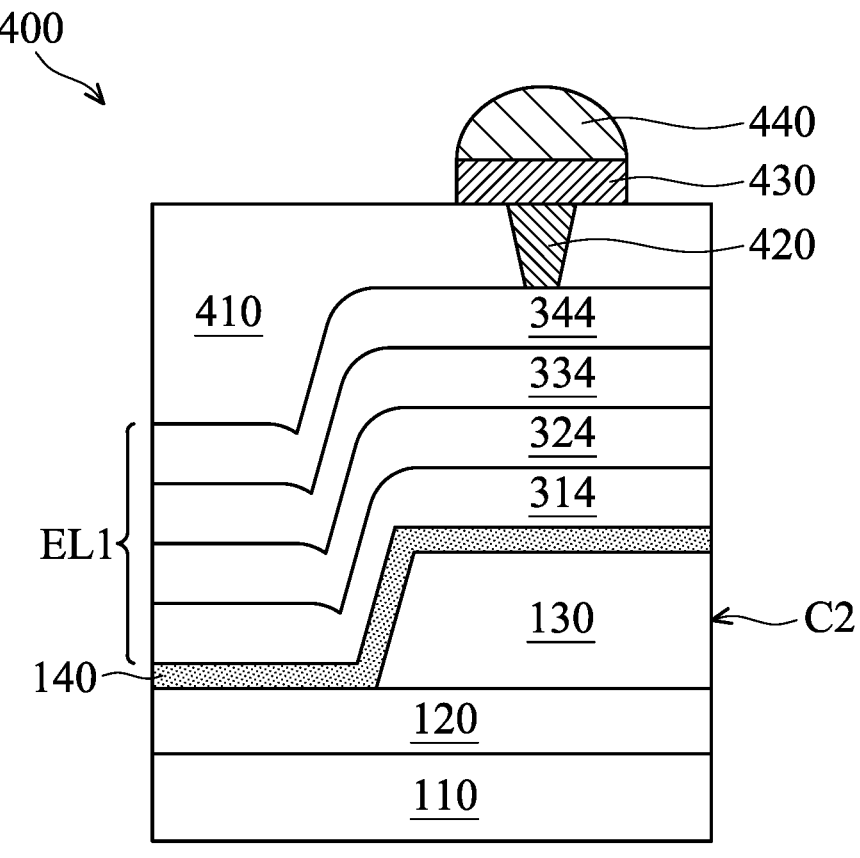
FIG. 4 is a cross-sectional view of a semiconductor device structure, in accordance with some embodiments.

FIG. 4 is a cross-sectional view of a semiconductor device structure 400, in accordance with some embodiments. As shown in FIG. 4, after the step of FIG. 3H, a dielectric layer 410 is formed over the capacitor C2, in accordance with some embodiments.

The dielectric layer 410 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer 410 includes a low-k material or a porous dielectric material having a k-value which is lower than that of silicon oxide, or lower than about 3.0 or about 4.5, in accordance with some embodiments.

As shown in FIG. 4, a conductive via 420 is formed in the dielectric layer 410, in accordance with some embodiments. The conductive via 420 is connected to the capacitor C2, in accordance with some embodiments. The conductive via 420 is made of a conductive material, such as metal (e.g., copper, aluminum, gold, silver, or tungsten) or alloys thereof, in accordance with some embodiments.

As shown in FIG. 4, a conductive pad 430 is formed over the conductive via 420, in accordance with some embodiments. The conductive pad 430 is made of a conductive material, such as metal (e.g., copper, aluminum, gold, silver, or tungsten) or alloys thereof, in accordance with some embodiments.

As shown in FIG. 4, a solder bump 440 is formed over the conductive pad 430, in accordance with some embodiments. The solder bump 440 is made of a conductive material, such as a tin-based alloy, in accordance with some embodiments. In this step, a semiconductor device structure 400 is substantially formed, in accordance with some embodiments.

Figure 5A:
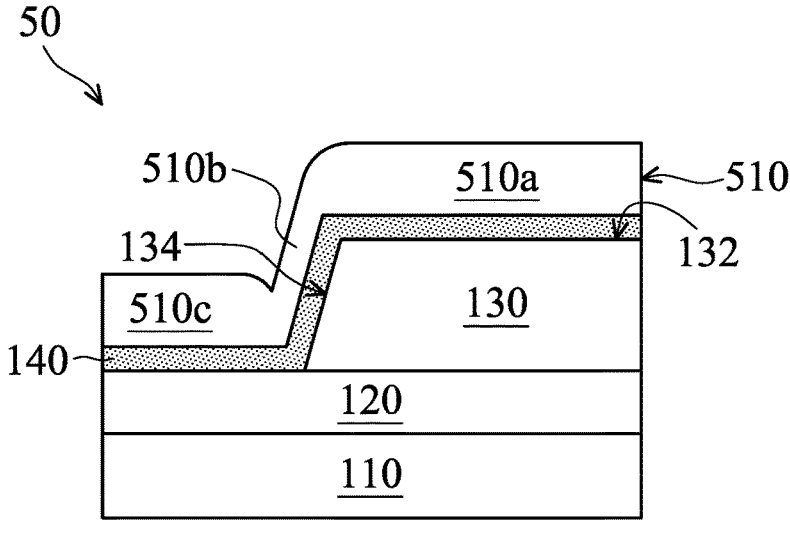
FIGS. 5A-5C are cross-sectional views of various stages of a process for forming a semiconductor device structure, in accordance with some embodiments.
Figures 1, 5A:
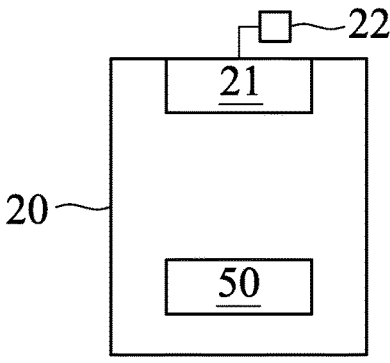
Figure 5B:
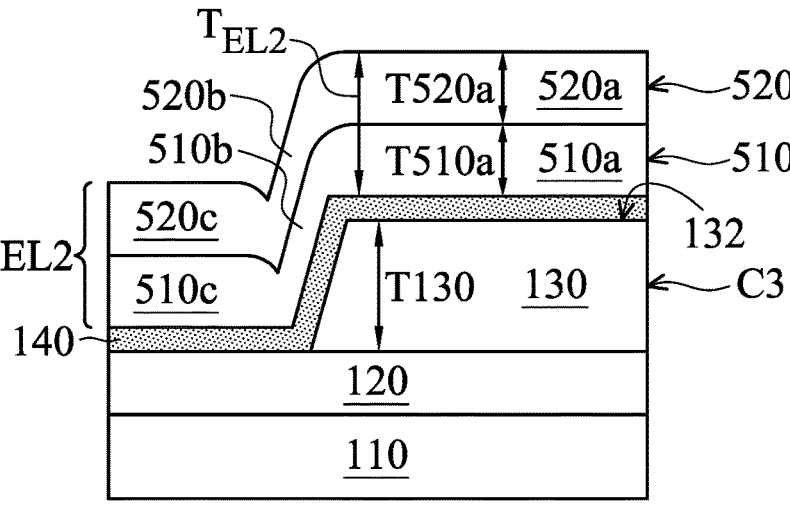
Figure 5C:
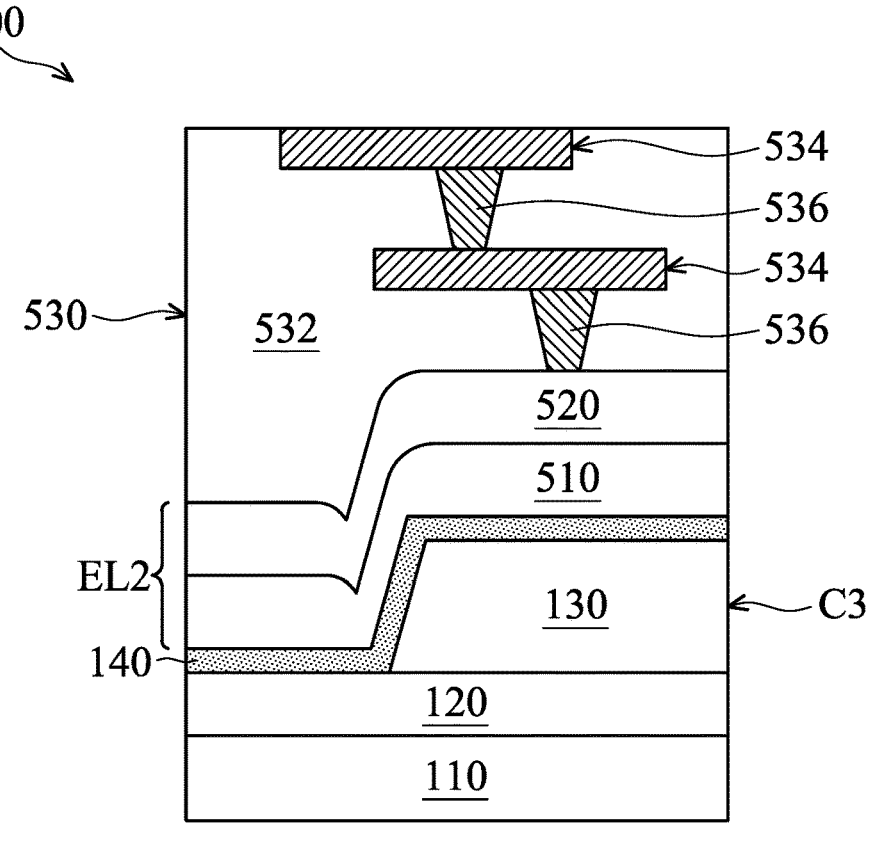

FIGS. 5A-5C are cross-sectional views of various stages of a process for forming a semiconductor device structure, in accordance with some embodiments. FIG. 5A-1 is a schematic diagram illustrating a chamber 20 and the semiconductor device structure 50, in accordance with some embodiments.

As shown in FIG. 5A, after the step of forming the electrode layer 130 of FIG. 1A, the capacitor dielectric layer 140 is formed over the electrode layer 130 and the interconnect structure 120, in accordance with some embodiments. As shown in FIGS. 5A and 5A-1, the substrate 110, the interconnect structure 120, the electrode layer 130, and the capacitor dielectric layer 140 together form a semiconductor device structure 50, in accordance with some embodiments.

As shown in FIGS. 5A and 5A-1, the semiconductor device structure 50 is disposed in the chamber 20, in accordance with some embodiments. The chamber 20 is the same as the chamber 20 of FIG. 1A-1, in accordance with some embodiments.

As shown in FIG. 5A, an electrode layer 510 is deposited over the capacitor dielectric layer 140, in accordance with some embodiments. The electrode layer 510 has a top portion 510a, a sidewall portion 510b, and a bottom portion 510c, in accordance with some embodiments.

The top portion 510a is over the capacitor dielectric layer 140 over the top surface 132 of the electrode layer 130, in accordance with some embodiments. The sidewall portion 510b is over the capacitor dielectric layer 140 over the sidewall 134 of the electrode layer 130, in accordance with some embodiments.

The sidewall portion 510b is connected between the top portion 510a and the bottom portion 510c, in accordance with some embodiments. The bottom portion 510c does not overlap the electrode layer 130, in accordance with some embodiments. The sidewall portion 510b is thinner than the top portion 510a, in accordance with some embodiments. The sidewall portion 510b is thinner than the bottom portion 510c, in accordance with some embodiments.

The electrode layer 510 is deposited using a physical vapor deposition process, in accordance with some embodiments. As shown in FIG. 5A-1, in the physical vapor deposition process, the power supply 22 delivers a sputtering power to the target 21, in accordance with some embodiments. The sputtering power is about 0 watt (W), in accordance with some embodiments.

In the physical vapor deposition process, an inert gas, such as argon, is flown into the chamber 20 at a rate sufficient to produce a chamber pressure of about 10 mTorr to about 50 mTorr, in accordance with some embodiments. The chamber pressure is also referred to as a process pressure, in accordance with some embodiments.

As shown in FIG. 5B, an electrode layer 520 is deposited over the electrode layer 510, in accordance with some embodiments. The electrode layer 520 has a top portion 520a, a sidewall portion 520b, and a bottom portion 520c, in accordance with some embodiments. The top portion 520a is over the top portion 510a of the electrode layer 510, in accordance with some embodiments. The sidewall portion 520b is over the sidewall portion 510b of the electrode layer 510, in accordance with some embodiments.

The sidewall portion 520b is connected between the top portion 520a and the bottom portion 520c, in accordance with some embodiments. The bottom portion 520c does not overlap the electrode layer 130, in accordance with some embodiments. The sidewall portion 520b is thinner than the top portion 520a, in accordance with some embodiments.

The sidewall portion 520b is thinner than the bottom portion 520c, in accordance with some embodiments.

The electrode layer 520 is deposited using a physical vapor deposition process, in accordance with some embodiments. As shown in FIG. 5A-1, in the physical vapor deposition process, the power supply 22 delivers a sputtering power to the target 21, in accordance with some embodiments. The sputtering power ranges from about 50 W to about 100 W, in accordance with some embodiments.

In the physical vapor deposition process, an inert gas, such as argon, is flown into the chamber 20 at a rate sufficient to produce a chamber pressure of about 150 mTorr to about 250 mTorr, in accordance with some embodiments. The chamber pressure is also referred to as a process pressure, in accordance with some embodiments.

The sputtering power of the physical vapor deposition process of forming the electrode layer 510 is less than that of forming the electrode layer 520, in accordance with some embodiments. The process pressure of the physical vapor deposition process of forming the electrode layer 510 is less than that of forming the electrode layer 520, in accordance with some embodiments. Therefore, the deposition rate of the electrode layer 510 is less than the deposition rate of the electrode layer 520, in accordance with some embodiments.

The deposition rate of the electrode layer 510 is relatively low, which prevents the electrode layer 510 (e.g., the sidewall portion 510b) from generating fractures or cracks, in accordance with some embodiments. Therefore, the stability of the electrode layer 510 is improved, in accordance with some embodiments. The deposition rate of the electrode layer 520 is relatively high, which reduces the process time, in accordance with some embodiments.

The electrode layers 510 and 520 together form an electrode layer EL2, in accordance with some embodiments. The thickness $T_{EL2}$ of the electrode layer EL2 is substantially equal to the thickness T130 of the electrode layer 130, in accordance with some embodiments. In some embodiments, the thickness $T_{EL2}$ is greater than the thickness T130. In some embodiments, the thickness $T_{EL2}$ is less than the thickness T130. The electrode layers 130 and EL2 and the capacitor dielectric layer 140 together form a capacitor C3, in accordance with some embodiments.

In some embodiments, the thicknesses T510a and T520a of the top portions 510a and 520a are substantially equal to each other. In some other embodiments, the thicknesses T510a and T520a are different from each other. The thickness T510a or T520a ranges from about 150 Å to about 500 Å, in accordance with some embodiments. The thickness T130 ranges from about 300 Å to about 1000 Å, in accordance with some embodiments.

As shown in FIG. 5C, a wiring structure 530 is formed over the capacitor C3 and the interconnect structure 120, in accordance with some embodiments. In this step, a semiconductor device structure 500 is substantially formed, in accordance with some embodiments.

The wiring structure 530 includes a dielectric layer 532, wiring layers 534, and conductive vias 536, in accordance with some embodiments. The wiring layers 534 and the conductive vias 536 are in the dielectric layer 532, in accordance with some embodiments. The conductive vias 536 are electrically connected between the wiring layers 534 and the capacitor C3, in accordance with some embodiments.

The dielectric layer 532 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer 532 includes a low-k material or a porous dielectric material having a k-value which is lower than that of silicon oxide, or lower than about 3.0 or about 2.5, in accordance with some embodiments. The wiring layers 534 and the conductive vias 536 are made of a conductive material, such as metal (e.g., copper, aluminum, gold, silver, or tungsten) or alloys thereof, in accordance with some embodiments.

Figure 6:
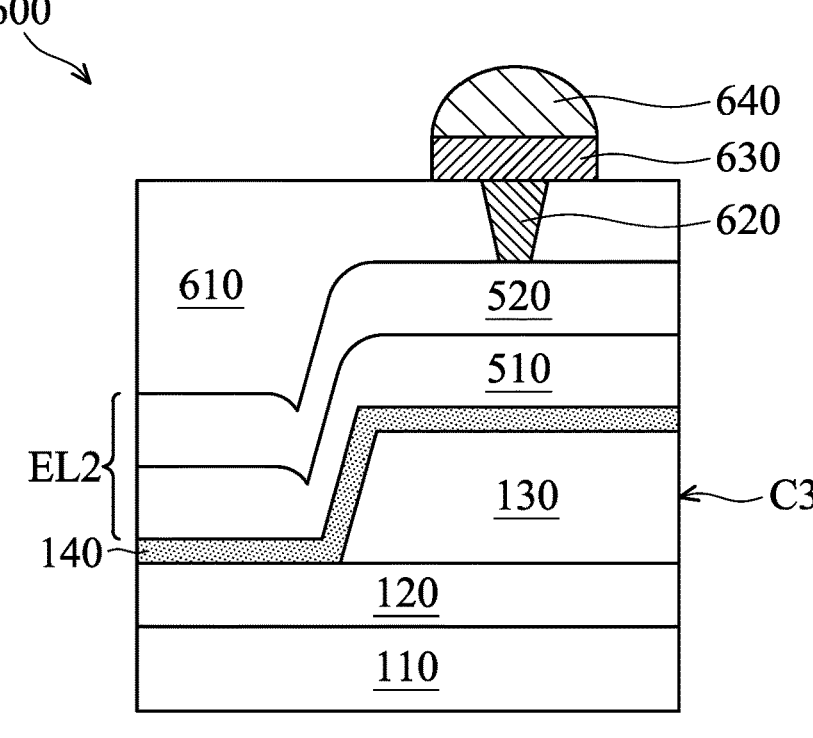
FIG. 6 is a cross-sectional view of a semiconductor device structure, in accordance with some embodiments.

FIG. 6 is a cross-sectional view of a semiconductor device structure 600, in accordance with some embodiments. As shown in FIG. 6, after the step of FIG. 5B, a dielectric layer 610 is formed over the capacitor C3, in accordance with some embodiments.

The dielectric layer 610 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer 610 includes a low-k material or a porous dielectric material having a k-value which is lower than that of silicon oxide, or lower than about 3.0 or about 4.5, in accordance with some embodiments.

As shown in FIG. 6, a conductive via 620 is formed in the dielectric layer 610, in accordance with some embodiments. The conductive via 620 is connected to the capacitor C3, in accordance with some embodiments. The conductive via 620 is made of a conductive material, such as metal (e.g., copper, aluminum, gold, silver, or tungsten) or alloys thereof, in accordance with some embodiments.

As shown in FIG. 6, a conductive pad 630 is formed over the conductive via 620, in accordance with some embodiments. The conductive pad 630 is made of a conductive material, such as metal (e.g., copper, aluminum, gold, silver, or tungsten) or alloys thereof, in accordance with some embodiments.

As shown in FIG. 6, a solder bump 640 is formed over the conductive pad 630, in accordance with some embodiments. The solder bump 640 is made of a conductive material, such as a tin-based alloy, in accordance with some embodiments. In this step, a semiconductor device structure 600 is substantially formed, in accordance with some embodiments.

Figure 7:
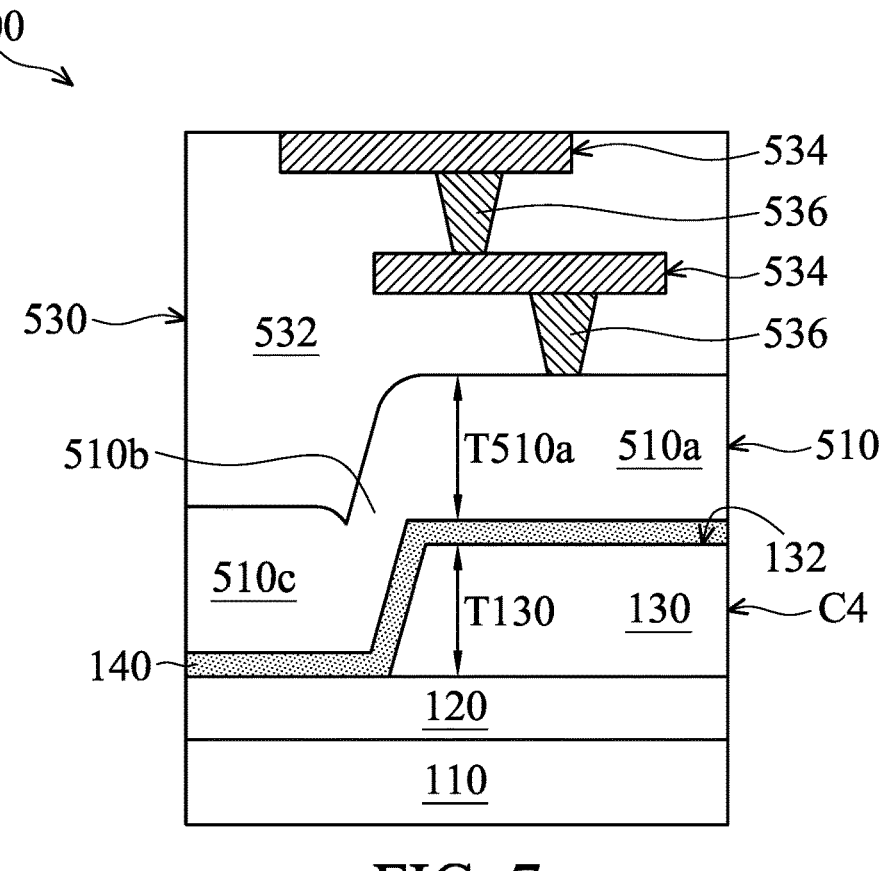
FIG. 7 is a cross-sectional view of a semiconductor device structure, in accordance with some embodiments.

FIG. 7 is a cross-sectional view of a semiconductor device structure 700, in accordance with some embodiments. As shown in FIG. 7, the semiconductor device structure 700 is similar to the semiconductor device structure 500 of FIG. 5C, except that the semiconductor device structure 700 does not have the electrode layer 520, in accordance with some embodiments. The conductive via 536 is in direct contact with the electrode layer 510, in accordance with some embodiments.

The electrode layers 130 and 510 and the capacitor dielectric layer 140 together form a capacitor C4, in accordance with some embodiments.

In some embodiments, the thickness T510a of the top portion 510a and the thickness T130 of the electrode layer 130 are substantially equal to each other. In some other embodiments, the thicknesses T510a and T130 are different from each other. The thickness T510a or T130 ranges from about 300 Å to about 1000 Å, in accordance with some embodiments.

Figure 8:
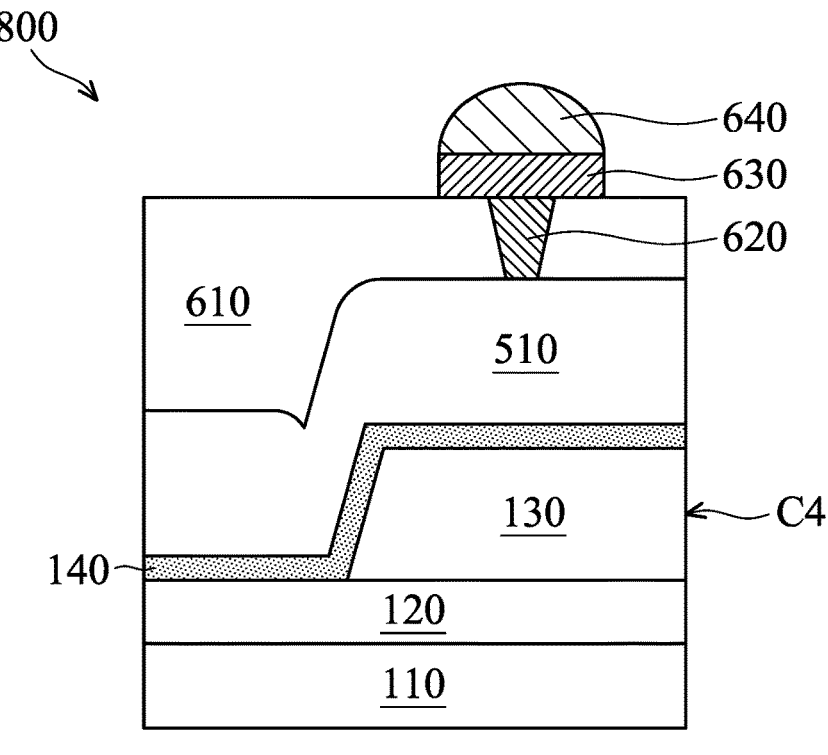
FIG. 8 is a cross-sectional view of a semiconductor device structure, in accordance with some embodiments.

FIG. 8 is a cross-sectional view of a semiconductor device structure 800, in accordance with some embodiments. As shown in FIG. 8, the semiconductor device structure 800 is similar to the semiconductor device structure 600 of FIG. 6, except that the semiconductor device structure 800 does not have the electrode layer 520, in accordance with some embodiments. The conductive via 620 is in direct contact with the electrode layer 510, in accordance with some embodiments. The electrode layers 130 and 510 and the capacitor dielectric layer 140 together form a capacitor C4, in accordance with some embodiments.

Processes and materials for forming the semiconductor device structures 200, 300, 400, 500, 600, 700 and 800 may be similar to, or the same as, those for forming the semiconductor device structure 100 described above. Elements designated by the same or similar reference numbers as those in FIGS. 1A to 8 have the same or similar structures and the materials. Therefore, the detailed descriptions thereof will not be repeated herein.

In accordance with some embodiments, semiconductor device structures and methods for forming the same are provided. The methods (for forming the semiconductor device structure) form a first electrode layer over a capacitor dielectric layer, which conformally covers a top surface and a sidewall of a second electrode layer, and perform a bombardment process to the first electrode layer to improve the thickness uniformity and the reliability of the first electrode layer.

The methods sequentially deposit a first electrode layer and a second electrode layer over a capacitor dielectric layer, and the deposition rate of the first electrode layer is less than that of the second electrode layer. The deposition rate of the first electrode layer is relatively low, which prevents the first electrode layer from generating fractures or cracks and improves the stability of the first electrode layer. The deposition rate of the second electrode layer is relatively high, which reduces the process time.

In accordance with some embodiments, a method for forming a semiconductor device structure is provided. The method includes forming a first electrode layer over a substrate. The method includes forming a capacitor dielectric layer over the first electrode layer and the substrate. The capacitor dielectric layer conformally covers a top surface and a sidewall of the first electrode layer. The method includes depositing a second electrode layer over the capacitor dielectric layer. The second electrode layer has a first top portion, a first sidewall portion, and a first bottom portion, the first top portion is over the capacitor dielectric layer over the top surface of the first electrode layer, the first sidewall portion is over the capacitor dielectric layer over the sidewall of the first electrode layer and connected between the first top portion and the first bottom portion. The method includes bombarding the second electrode layer with ions of an inert gas to sputter first atoms from the second electrode layer. The first atoms are deposited to the second electrode layer after the bombarding of the second electrode layer. The second electrode layer becomes a treated second electrode layer after the first atoms are deposited to the second electrode layer. The treated second electrode layer has a treated first top portion, a treated first sidewall portion, and a treated first bottom portion. The treated first sidewall portion is over the sidewall of the first electrode layer and connected between the treated first top portion and the treated first bottom portion, and the treated first sidewall portion is thicker than the first sidewall portion.

In accordance with some embodiments, a method for forming a semiconductor device structure is provided. The method includes forming a first electrode layer over a substrate. The method includes forming a capacitor dielectric layer over the first electrode layer and the substrate. The capacitor dielectric layer conformally covers a top surface and a sidewall of the first electrode layer. The method includes depositing a second electrode layer over the capacitor dielectric layer covering the top surface and the sidewall of the first electrode layer. The method includes depositing a third electrode layer over the second electrode layer. A first deposition rate of the second electrode layer is less than a second deposition rate of the third electrode layer.

In accordance with some embodiments, a semiconductor device structure is provided. The semiconductor device structure includes a substrate. The semiconductor device structure includes a first electrode layer over the substrate. The semiconductor device structure includes a capacitor dielectric layer over the first electrode layer and the substrate. The capacitor dielectric layer conformally covers a top surface and a sidewall of the first electrode layer. The semiconductor device structure includes a second electrode layer over the capacitor dielectric layer. The second electrode layer over the sidewall of the first electrode layer has a first surface roughness greater than a second surface roughness of the second electrode layer over the top surface of the first electrode layer and is thinner than the second electrode layer over the top surface. The semiconductor device structure includes a third electrode layer over the second electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a first electrode layer over a substrate;

forming a capacitor dielectric layer over the first electrode layer and the substrate, wherein the capacitor dielectric layer conformally covers a top surface and a sidewall of the first electrode layer;

depositing a second electrode layer over the capacitor dielectric layer, wherein the second electrode layer has a first top portion, a first sidewall portion, and a first bottom portion, the first top portion is over the capacitor dielectric layer over the top surface of the first electrode layer, the first sidewall portion is over the capacitor dielectric layer over the sidewall of the first electrode layer and connected between the first top portion and the first bottom portion; and bombarding the second electrode layer with ions of an inert gas to sputter first atoms from the second electrode layer, wherein the first atoms are deposited to the second electrode layer after the bombarding of the second electrode layer, the second electrode layer becomes a treated second electrode layer after the first atoms are deposited to the second electrode layer, the treated second electrode layer has a treated first top portion, a treated first sidewall portion, and a treated first bottom portion, the treated first sidewall portion is over the sidewall of the first electrode layer and connected between the treated first top portion and the treated first bottom portion, and the treated first sidewall portion is thicker than the first sidewall portion.

2. The method for forming the semiconductor device structure as claimed in claim 1, wherein the bombarding of the second electrode layer comprises:

anisotropically bombarding the second electrode layer, wherein the first atoms are isotropically deposited to the second electrode layer after the anisotropically bombarding of the second electrode layer.

3. The method for forming the semiconductor device structure as claimed in claim 2, wherein a bombardment direction of the anisotropically bombarding of the second electrode layer is substantially perpendicular to the top surface of the first electrode layer.

4. The method for forming the semiconductor device structure as claimed in claim 1, wherein the treated first top portion of the treated second electrode layer over the top surface of the first electrode layer is thinner than the first top portion of the second electrode layer.

5. The method for forming the semiconductor device structure as claimed in claim 4, wherein the treated first bottom portion of the treated second electrode layer is thinner than the first bottom portion of the second electrode layer.

6. The method for forming the semiconductor device structure as claimed in claim 1, wherein in the second electrode layer, the first sidewall portion is thinner than the first top portion and thinner than the first bottom portion.

7. The method for forming the semiconductor device structure as claimed in claim 6, wherein in the treated second electrode layer, the treated first sidewall portion is thinner than the treated first top portion and thinner than the treated first bottom portion.

8. The method for forming the semiconductor device structure as claimed in claim 7, wherein a first thickness difference between the treated first top portion and the treated first sidewall portion is less than a second thickness difference between the first top portion and the first sidewall portion.

9. The method for forming the semiconductor device structure as claimed in claim 8, wherein a third thickness difference between the treated first bottom portion and the treated first sidewall portion is less than a fourth thickness difference between the first bottom portion and the first sidewall portion.

10. The method for forming the semiconductor device structure as claimed in claim 1, wherein in the treated second electrode layer, a first surface roughness of the treated first sidewall portion is greater than a second surface roughness of the treated first top portion.

11. The method for forming the semiconductor device structure as claimed in claim 10, wherein in the treated second electrode layer, the first surface roughness of the treated first sidewall portion is greater than a third surface roughness of the treated first bottom portion.

12. The method for forming the semiconductor device structure as claimed in claim 1, further comprising:

depositing a third electrode layer over the treated second electrode layer, wherein the third electrode layer has a second top portion, a second sidewall portion, and a second bottom portion, the second top portion is over the treated first top portion of the treated second electrode layer, and the second sidewall portion is over the treated first sidewall portion and connected between the second top portion and the second bottom portion; and bombarding the third electrode layer with the ions to sputter second atoms from the third electrode layer, wherein the second atoms are deposited to the third electrode layer after the bombarding of the third electrode layer, the third electrode layer becomes a treated third electrode layer after the second atoms are deposited to the third electrode layer, the treated third electrode layer has a treated second top portion, a treated second sidewall portion, and a treated second bottom portion, the treated second sidewall portion is over the sidewall of the first electrode layer and connected between the treated second top portion and the treated second bottom portion, and the treated second sidewall portion is thicker than the second sidewall portion.

13. The method for forming the semiconductor device structure as claimed in claim 12, wherein the treated second sidewall portion is thinner than the treated second top portion and thinner than the treated second bottom portion, and in the treated third electrode layer, a first surface roughness of the treated second sidewall portion is greater than a second surface roughness of the treated second top portion and greater than a third surface roughness of the treated second bottom portion.

14. The method for forming the semiconductor device structure as claimed in claim 1, wherein the depositing of the second electrode layer and the bombarding of the second electrode layer are performed in a same chamber.

15. A method for forming a semiconductor device structure, comprising:

forming a first electrode layer over a substrate;

forming a capacitor dielectric layer over the first electrode layer and the substrate, wherein the capacitor dielectric layer conformally covers a top surface and a sidewall of the first electrode layer;

depositing a second electrode layer over the capacitor dielectric layer covering the top surface and the sidewall of the first electrode layer; and depositing a third electrode layer over the second electrode layer, wherein a first deposition rate of the second electrode layer is less than a second deposition rate of the third electrode layer.

16. The method for forming the semiconductor device structure as claimed in claim 15, wherein a first process pressure of the depositing of the second electrode layer is less than a second process pressure of the depositing of the third electrode layer.

17. The method for forming the semiconductor device structure as claimed in claim 16, wherein the depositing of the second electrode layer comprises performing a first physical vapor deposition process, the depositing of the third electrode layer comprises performing a second physical vapor deposition process, and a first sputtering power of the first physical vapor deposition process is less than a second sputtering power of the second physical vapor deposition process.

18. A method for forming a semiconductor device structure, comprising:

forming a first electrode layer over a substrate;

forming a capacitor dielectric layer over the first electrode layer;

depositing a second electrode layer over the capacitor dielectric layer, wherein the second electrode layer has a first surface roughness and second surface roughness, and the second surface roughness is lower than the first surface roughness; and depositing a third electrode layer over the second electrode layer, wherein a first deposition rate of the second electrode layer is less than a second deposition rate of the third electrode layer.

19. The method for forming the semiconductor device structure as claimed in claim 18, wherein a first process pressure of the depositing of the second electrode layer is different than a second process pressure of the depositing of the third electrode layer.

20. The method for forming the semiconductor device structure as claimed in claim 19, wherein the depositing of the second electrode layer comprises performing a first physical vapor deposition process, the depositing of the third electrode layer comprises performing a second physical vapor deposition process, and a first sputtering power of the first physical vapor deposition process is less than a second sputtering power of the second physical vapor deposition process.

\* \* \* \* \*